United States Patent
Kong et al.

(10) Patent No.: US 9,893,233 B2
(45) Date of Patent: Feb. 13, 2018

(54) LIGHT EMITTING DIODE AND MANUFACTURING METHOD THEREFOR

(71) Applicant: GWANGJU INSTITUTE OF SCIENCE AND TECHNOLOGY, Gwangju (KR)

(72) Inventors: Duk Jo Kong, Gwangju (KR); Dong Seon Lee, Gwangju (KR); Chang Mo Kang, Gwangju (KR); Jun Youb Lee, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/128,684

(22) PCT Filed: Sep. 16, 2014

(86) PCT No.: PCT/KR2014/008514
§ 371 (c)(1),
(2) Date: Sep. 23, 2016

(87) PCT Pub. No.: WO2015/147390
PCT Pub. Date: Oct. 1, 2015

(65) Prior Publication Data
US 2017/0133553 A1    May 11, 2017

(30) Foreign Application Priority Data
Mar. 25, 2014  (KR) .......................... 10-2014-0034951

(51) Int. Cl.
H01L 33/04    (2010.01)
H01L 31/0304  (2006.01)
(Continued)

(52) U.S. Cl.
CPC .......... *H01L 33/08* (2013.01); *H01L 33/0075* (2013.01); *H01L 33/14* (2013.01); *H01L 33/32* (2013.01)

(58) Field of Classification Search
CPC ........ H01L 27/156; H01L 33/20; H01L 33/08
(Continued)

(56) References Cited

U.S. PATENT DOCUMENTS

| | | | |
|---|---|---|---|
| 2009/0072272 A1* | 3/2009 | Suh | ...................... H01L 29/1066 257/194 |
| 2011/0095260 A1* | 4/2011 | Kim | ...................... H01L 27/156 257/13 |
| 2012/0119199 A1* | 5/2012 | Okamoto | ............... H05B 33/26 257/40 |

FOREIGN PATENT DOCUMENTS

| | | |
|---|---|---|
| JP | 2013-141038 A | 7/2013 |
| KR | 10-2011-0046017 A | 5/2011 |
| KR | 10-2013-0043708 A | 5/2013 |

OTHER PUBLICATIONS

International Search Report dated Jan. 2, 2015 corresponding to International Application No. PCT/KR2014/008514.

* cited by examiner

*Primary Examiner* — Kimberly Rizkallah
*Assistant Examiner* — Brian Turner
(74) *Attorney, Agent, or Firm* — Hauptman Ham, LLP

(57) ABSTRACT

A light emitting diode and a manufacturing method therefore are provided. The light emitting diode includes at least: a first light emitting structure, formed on a substrate, in which a first n-GaN layer, a first active layer and a first p-GaN layer are sequentially layered; a first n-type electrode formed on one side of the upper part of the first n-GaN layer; a current diffusion layer, formed on the first light emitting structure, in which at least one hole is arranged; and a second light
(Continued)

emitting structure in which a second p-GaN layer, which is formed in a region of a conductive layer in which at least one hole is arranged, and a second active layer and a second n-GaN layer, which are formed on the second p-GaN layer, are sequentially layered.

19 Claims, 8 Drawing Sheets

(51) Int. Cl.
    *H01L 29/06*     (2006.01)
    *H01L 33/08*     (2010.01)
    *H01L 33/32*     (2010.01)
    *H01L 33/14*     (2010.01)
    *H01L 33/00*     (2010.01)

(58) Field of Classification Search
    USPC .......................................... 257/13, 79, 88, 89
    See application file for complete search history.

LIGHT EMITTING DIODE AND MANUFACTURING METHOD THEREFOR

CROSS REFERENCE TO RELATED APPLICATION

This application claims the priority of Korean Patent Application No. 10-2014-0034951, filed on Mar. 25, 2014 in the KIPO (Korean Intellectual Property Office). Further, this application is the National Phase application of International Application No. PCT/KR2014/008514 filed Sep. 16, 2014, which designates the United States and was published in Korean.

TECHNICAL FIELD

The present invention relates to a light emitting diode and a method of manufacturing the same, and more particularly, to a multi-joined light emitting diode and a method of manufacturing the same.

BACKGROUND ART

A light emitting diode (LED) is a semiconductor light emitting device composed of compound semiconductors and capable of realizing various colors, and is used as a general light source and a display light source, particularly, as a light source for IT devices including mobile phones. The light emitting diode has a much smaller size than typical light sources and market share thereof is rapidly expanding due to good properties in terms of low power consumption, rapid response and long lifespan. With expansion of applications of light emitting diodes, there is an increasing need for high brightness and high efficiency micro-pixel LEDs and novel displays, which can replace low brightness LED products such as typical full LEDs having problems of low efficiency and low pixel density in the display market. Particularly, with increasing demand for blue and white light emitting diodes with high efficiency as backlight sources for mobile displays, there is an increasing need for development for such LEDs.

Such a light emitting diode is generally formed of Group III-V nitride-based compound semiconductors, which have a direct transition type large energy band-gap so as to convert energy generated upon recombination of electrons and holes into light. Since the light emitting diode formed of the Group III-V nitride-based compound semiconductors can emit light in substantially the entire wavelength range depending upon the composition of the nitride-based compound semiconductors and can perform blue laser oscillation, various attempts have been made to develop a high pixel density and high efficiency light emitting diode based on such characteristics of the light emitting diode.

In a conventional technique for realizing white light using a light emitting diode capable of emitting various colors, phosphors are provided to the light emitting diode in order to realize a certain color through excitation thereof. However, the light emitting diode including the phosphors has a poor color rendering index (CRI), which indicates a poor degree of color realization of a certain object when illuminated with light, and provides different color rendering indexes depending upon current density, thereby making it difficult to secure color stability due to difficulty in regulation of color temperature and color rendering index which are main factors determining quality of a light source for illumination. Moreover, a conventional technique using quantum dot phosphors has a problem of deterioration in reliability due to low physicochemical stability, despite advantages of a wide selection width of wavelengths and improved luminous efficacy through high quantum efficiency.

Therefore, there is a need for development of a light emitting diode capable of realizing a high pixel density and high efficiency display without using phosphors.

DISCLOSURE

Technical Problem

Embodiments of the present invention provide a light emitting diode capable of realizing a high pixel density and high efficiency display and a method of manufacturing the same.

Technical Solution

In accordance with one aspect of the present invention, a method of manufacturing a light emitting diode includes: forming a first light emitting structure on a substrate by sequentially stacking a first n-GaN layer, a first active layer, and a first p-GaN layer thereon; forming a conductive layer having at least one hole on the first light emitting structure; forming a second p-GaN layer in a region in which the at least one hole of the conductive layer is disposed, by regrowing the first p-GaN layer through the at least one hole of the conductive layer; and forming a second light emitting structure on the second p-GaN layer by sequentially stacking a second active layer and a second n-GaN layer thereon.

In accordance with another aspect of the present invention, a method of manufacturing a light emitting diode includes: forming a first light emitting structure on a substrate by sequentially stacking a first n-GaN layer, a first active layer, and a first p-GaN layer thereon; forming a conductive layer having at least one hole on the first light emitting structure; forming a second p-GaN layer group in a region in which the at least one hole of the conductive layer is disposed, by regrowing the first p-GaN layer through the at least one hole of the conductive layer; and forming a second light emitting structure group on the second p-GaN layer group by sequentially stacking a second active layer group and a second n-GaN layer group thereon.

In accordance with a further aspect of the present invention, a light emitting diode includes: a first light emitting structure formed on a substrate and including a first n-GaN layer, a first active layer and a first p-GaN layer sequentially stacked thereon; a first n-type electrode formed at one side of an upper surface of the first n-GaN layer; a conductive layer formed on the first light emitting structure and having at least one hole; a second light emitting structure including a second p-GaN layer formed in a region in which the at least one hole of the conductive layer is disposed, and a second active layer and a second n-GaN layer sequentially stacked on the second p-GaN layer, wherein the second p-GaN layer is formed by regrowing the first p-GaN layer through the at least one hole of the conductive layer.

In accordance with yet another aspect of the present invention, a light emitting diode includes: a first light emitting structure formed on a substrate and including a first n-GaN layer, a first active layer and a first p-GaN layer sequentially stacked thereon; a conductive layer formed on the first light emitting structure and having at least one hole; and a second light emitting structure including a second p-GaN layer group formed in a region in which the at least one hole of the conductive layer is disposed, and a second active layer group and a second n-GaN layer group sequentially stacked on the second p-GaN layer, wherein the second p-GaN layer group is formed by regrowing the first p-GaN layer through the at least one hole of the conductive layer.

Advantageous Effects

According to embodiments of the present invention, a plurality of light emitting structures emitting light of two or more wavelengths is disposed on one light emitting diode, thereby realizing a high pixel density and high efficiency light emitting diode capable of emitting desired colors.

In addition, a conductive layer having at least one hole is disposed between the light emitting structures and is configured to serve as various roles such as a mask pattern for selective area growth of the light emitting structures, a current spreading layer for rapid current spreading of the light emitting structures, and a p-type contact layer, whereby the light emitting diode can have a simple structure and improved luminous efficacy.

The present invention is not limited to the above effects and other effects of the present invention will become apparent to those skilled in the art from the following detailed description of the invention.

BEST MODE

Figure 1A:
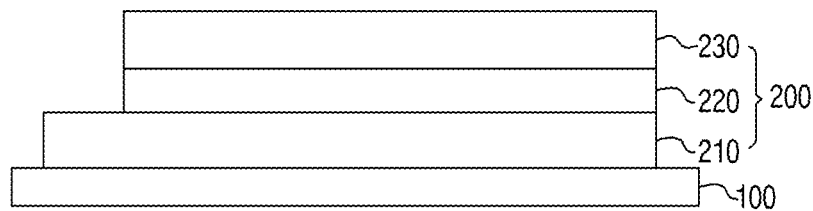
FIG. 1a to FIG. 1e are sectional views illustrating a method of manufacturing a light emitting diode according to one embodiment of the present invention.

Hereinafter, embodiments of the present disclosure will be described in detail with reference to the accompanying drawings.

The present invention can be implemented through various changes and modifications and specific embodiments of the present invention will be described by way of example with reference to the accompanying drawings. However, it should be understood that the present invention is not limited to the following embodiments and that various modifications, variations and alterations can be made without departing from the spirit and scope of the invention, as defined by the appended claims and equivalents thereof.

1. Method of Manufacturing Light Emitting Diode 1

One aspect of the present invention provides a method of manufacturing a light emitting diode.

According to one aspect of the present invention, the method of manufacturing a light emitting diode includes: 1) forming a first light emitting structure on a substrate by sequentially stacking a first n-GaN layer, a first active layer, and a first p-GaN layer thereon; 2) forming a conductive layer having at least one hole on the first light emitting structure; 3) forming a second p-GaN layer in a region in which the at least one hole of the conductive layer is disposed, by regrowing the first p-GaN layer through the at least one hole of the conductive layer; and 4) forming a second light emitting structure on the second p-GaN layer by sequentially stacking a second active layer and a second n-GaN layer thereon.

Step 1) is the step of forming a first light emitting structure by sequentially stacking a first n-GaN layer, a first active layer, and a first p-GaN layer on a substrate.

The substrate may be selected from any substrate known in the art so long as the substrate allows single crystal growth of a nitride-based compound semiconductor layer thereon. For example, the substrate may be one selected from among sapphire, silicon, silicon carbide (SiC), gallium nitride (GaN), gallium arsenide (GaAs), gallium phosphide (GaP), indium phosphide (InP), zinc oxide (ZnO), magnesium oxide (MgO), and lithium aluminate (LiAlO$_2$) substrates, without being limited thereto. Specifically, the substrate may be a sapphire substrate.

The first n-GaN layer, the first active layer, and the first p-GaN layer formed on the substrate may be composed of Group III-V nitride-based compounds and may be generally formed of materials represented by Al$_x$In$_y$Ga$_z$N ($0 \leq x \leq 1$, $0 \leq y \leq 1$, $0 \leq z \leq 1$, $0 \leq x+y+z \leq 1$). The first n-GaN layer may be formed by doping with n-type dopants, for example, Si, Ge, Se, or Te. The first p-GaN layer may be formed by doping with p-type dopants, for example, Mg, Zn, Ca, Sr, Ba, or Be. The doping concentration of the dopants may differ depending upon the kind of device to be manufactured. Each of the first n-GaN layer and the first p-GaN layer may have a thickness of 1 μm to 10 μm, without being limited thereto.

The first active layer may be a region of the light emitting diode, which emits light having a specific wavelength. Generally, a wavelength in the range of 430 nm to 470 nm corresponds to blue light, a wavelength in the range of 530 nm to 550 nm corresponds to green light, a wavelength in the range of 600 nm to 650 nm corresponds to yellow light, and a wavelength in the range of 640 nm to 670 nm corresponds to red light. Thus, a light emitting diode capable of emitting light having a specific wavelength can be realized through adjustment of the compositional ratio of the nitride-based compound of the first active layer. The second active layer described below may have the same characteristics as the first active layer.

The first active layer may have a multi-quantum well (MQW) structure composed of the nitride-based compound, or may have a single quantum well structure. The first active layer may have a thickness of 30 μm to 60 μm, without being limited thereto.

The first n-GaN layer, the first active layer, and the first p-GaN layer may be formed on the substrate through any deposition method known in the art, for example, e-beam evaporation, metal organic chemical vapor deposition (MOCVD), hydride vapor phase epitaxy (HVPE), molecular beam epitaxy (MBE), plasma laser deposition (PLD), and sputtering, without being limited thereto.

After forming the first light emitting structure including the first n-GaN layer, the first active layer, and the first p-GaN layer sequentially stacked on the substrate, the manufacturing method may further include performing mesa etching with respect to a portion of the first light emitting structure so as to expose a portion of the first n-GaN layer, followed by forming a first n-type electrode at one side of an upper surface of the exposed first n-GaN layer. Alternatively, mesa etching may be performed after forming the second light emitting structure described below. Thus, a time point for mesa etching is not particularly limited. The first n-type electrode may be formed of an electrode material known in the art, for example, at least one metal selected from the group composed of Au, Ag, Ni, Co, Cu, Pd, Pt, Ru, Ir, Cr, Mn, Mo, W, Re, Fe, Sc, Ti, Sn, Ge, Sb, Al, Zn, and lanthanide metals.

Step 2) is the step of forming a conductive layer having at least one hole on the first light emitting structure.

The conductive layer may be composed of an electrically conductive metal and may serve as a mask pattern, a current spreading layer and a p-type contact layer depending upon embodiments described below. The conductive layer may be composed of at least one selected from among, for example, Co, Ni, Pt, Au, Se, Re, Ir, Pb, Ag, Cr, Zn, conducive metals having a work function of 4.4 eV or more, carbon nanotubes (CNT), graphene, indium tin oxide (ITO), ZnO, and IZO.

The step of forming a conductive layer having at least one hole on the first light emitting structure may include depositing the conductive layer on the first light emitting structure; and forming a pattern having at least one hole on the conductive layer through lithography.

The step of depositing the conductive layer on the first light emitting structure may be performed by any deposition method known in the art, for example, atomic layer deposition (ALD), chemical vapor deposition (CVD), e-beam or thermal evaporation, and electrochemical deposition, without being limited thereto.

Upon deposition of the conductive layer, temperature and environment for deposition may be set as in methods known in the art, and deposition pressure may be set in the range of atmospheric pressure to about $10^{-12}$ Torr, without being limited thereto.

The conductive layer may have a thickness of 10 nm to 1 μm. If the thickness of the conductive metal layer is less than 10 nm, it is difficult to use the conductive layer as a mask pattern for growth of a second p-GaN layer described below. If the thickness of the conductive layer exceeds 1 μm, the process of forming the conductive layer can become complicated and the hole formed in the conductive layer can be deepened, thereby making it difficult to perform selective area growth (SAG) for forming the second p-GaN layer. Thus, the conductive layer having a thickness of 10 nm to 1 μm provides optimal conditions.

A pattern having one or more holes arranged at regular intervals may be formed on the conductive layer deposited on the first light emitting structure through lithograph. Holes may have a shape such as a circular shape, an elliptical shape, a triangular shape, or a polygonal shape, and the number of holes varies according to embodiments. Lithography may be performed through any method known in the art, for example, photolithography and etching.

Step 3) is the step of forming a second p-GaN layer in a region in which the at least one hole of the conductive layer is disposed, by regrowing the first p-GaN layer through the at least one hole of the conductive layer.

The second p-GaN layer is a GaN layer doped with p-type dopants and may be formed in the region in which the at least one hole of the conductive layer formed on the first light emitting structure is disposed. That is, the second p-GaN layer may be formed on the first p-GaN layer of the first light emitting structure in a region in which the at least one hole of the conductive layer is not disposed on the first light emitting structure. With this structure, the second p-GaN layer may be formed by regrowth of the first p-GaN layer through the at least one hole of the conductive layer. Thus, two regions, that is, a region of the conductive layer and a region of the second p-GaN layer, may be formed on the first light emitting structure.

The step of forming the second p-GaN layer through regrowth of the first p-GaN layer may be performed through selective area growth (SAG). Here, selective area growth may generally refer to a technique in which a mask pattern is formed on a substrate such that a target material can be grown only on an exposed region corresponding to an open region in the mask pattern. In the present invention, the conductive layer formed on the first p-GaN layer and having at least one hole serves as a mask pattern, and the second p-GaN layer may be formed by regrowing the first p-GaN layer in the region in which the at least one hole of the conductive layer is disposed to expose the first p-GaN layer. Thus, the structure of the second p-GaN layer can be affected by the structure of the at least one hole of the conductive layer, which serves as the mask pattern. Further, selective area growth may also be adopted in the step of forming a second light emitting structure on the second p-GaN layer by sequentially stacking a second active layer and a second n-GaN layer thereon.

The second p-GaN layer may be formed to contact a sidewall of the conductive layer or an upper surface thereof. That is, when the second p-GaN layer is formed by regrowing the first p-GaN layer through the at least one hole of the conductive layer, the second p-GaN layer may be formed to contact the sidewall of the conductive layer, or may be formed to contact the upper surface thereof. Thus, the second p-GaN layer may have the same size as the diameter of the at least one hole of the conductive layer, or may include a portion in which the second p-GaN layer has the same size as the diameter of the at least one hole of the conductive layer and a portion in which the second p-GaN layer is formed on the upper surface of the conductive layer. As such, with the structure wherein the second p-GaN layer is formed to contact the upper surface of the conductive layer, the second p-GaN layer may have any size, as needed, instead of being limited to the size of the hole formed in the conductive layer. As a result, the size of the second active layer to be formed on the second p-GaN layer can be enlarged, thereby enabling enlargement of a luminous area of the second light emitting structure including the second active layer. Further, since the second p-GaN layer is formed to contact the sidewall of the conductive layer or the upper surface thereof, the conductive layer can serve as a p-contact layer of the second light emitting structure including the second p-GaN layer.

The method may further include forming an insulation layer in a region of the conductive layer, in which the at least one hole of the conductive layer is not disposed, and the insulation layer may have at least one hole located corresponding to the at least one hole of the conductive layer. The insulation layer may be formed in order to insulate a p-type electrode formed at one side of the upper surface of the conductive layer and a second n-type electrode formed at one side of the upper surface of the second n-GaN layer from a second light emitting structure described below. The insulation layer is formed in the region of the conductive layer, in which the at least one hole of the conductive layer is not disposed, such that the second p-GaN layer formed through the at least one hole of the conductive layer or the second light emitting structure including the second p-GaN layer can contact a sidewall of the insulation layer. In this way, when the insulation layer having at least one hole is formed in the region of the conductive layer in which the at least one hole of the conductive layer is not disposed, the second p-GaN layer may also be formed on the insulation layer. In the structure wherein the second p-GaN layer is formed on the insulation layer formed on the conductive layer, the size of the second p-GaN layer is not limited to the size of the hole formed in the insulation layer.

The insulation layer may be formed of an insulation material, and may include silicon oxide or silicon nitride, without being limited thereto. For example, the insulation layer may be formed of $SiO_2$, SOG (spin-on-glass), or a material having thermal resistance at a temperature of 900° C. or less. The insulation layer may be formed by atomic layer deposition (ALD), chemical vapor deposition (CVD), physical vapor deposition (PVD), or spin coating according to a material for the insulation layer.

Step 4) is the step of forming a second light emitting structure on the second p-GaN layer by sequentially stacking a second active layer and a second n-GaN layer thereon.

The second active layer formed on the second p-GaN layer may have a multi-quantum well (MQW) structure composed of a nitride-based compound, or may have a single quantum well structure. The second active layer may have a thickness of 30 μm to 60 μm, without being limited thereto. Like the first active layer described above, the second active layer is a region of the light emitting diode, which emits light having a specific wavelength, and may be composed of a nitride-based compound having a different compositional ratio than the first active layer or a nitride-based compound having the same compositional ratio as that of the first active layer, as needed.

The second n-GaN layer formed on the second active layer is a GaN layer doped with n-type dopants and may have a similar size to that of the second active layer. Alternatively, the second n-GaN layer may be disposed as an uppermost layer of the light emitting diode and may have a large size so as to cover both the active layer and a region in which the active layer is not formed. The step of forming the second light emitting structure on the second p-GaN layer by sequentially stacking the second active layer and the second n-GaN layer thereon may be performed through a typical deposition method known in the art.

As described above, with the structure wherein the first light emitting structure is formed on the substrate and the second light emitting structure is formed on the first light emitting structure, the light emitting diode according to the present invention can emit various colors through a plurality of active layers emitting light of two or more wavelengths and a plurality of light emitting structures including the active layers.

After the step of forming the second light emitting structure, the method may further include forming a second n-type electrode at one side of the upper surface of the second n-GaN layer; and forming a p-type electrode at one side of the upper surface of the conductive layer.

The second n-type electrode and the p-type electrode may be composed of electrode materials known in the art, for example, at least one selected from the group composed of Au, Ag, Ni, Co, Cu, Pd, Pt, Ru, Ir, Cr, Mn, Mo, W, Re, Fe, Sc, Ti, Sn, Ge, Sb, Al, Zn, and lanthanide metals.

The first n-type electrode may be electrically connected to the p-type electrode in order to drive the first light emitting structure. Further, the second n-type electrode may be electrically connected to the p-type electrode in order to drive the second light emitting structure.

FIG. 1a to FIG. 1e are sectional views illustrating a method of manufacturing a light emitting diode according to one embodiment of the present invention.

Referring to FIG. 1a to FIG. 1e, FIG. 1a shows a first light emitting structure 200 including a first n-GaN layer 210, a first active layer 220, and a first p-GaN layer 230 sequentially stacked on a substrate 100, in which the first light emitting structure 200 is partially removed by mesa etching in order to form a first n-type electrode 240 at one side of an upper surface of the first n-GaN layer 210.

Figure 1B:
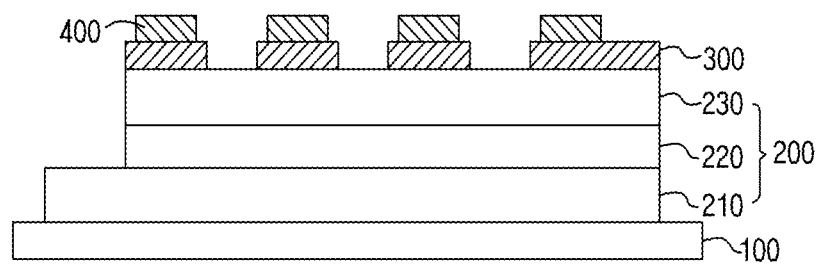

FIG. 1b shows a conductive layer 300 formed on the first p-GaN layer 230 of the first light emitting structure 200 on the substrate 100 and having at least one hole. The conductive layer 300 may be formed of at least one selected from among, for example, Co, Ni, Pt, Au, Se, Re, Ir, Pb, Ag, Cr, Zn, conducive metals having a work function of 4.4 eV or more, carbon nanotubes (CNT), graphene, indium tin oxide (ITO), ZnO, and IZO. After the conductive layer is deposited on an overall upper surface of the first p-GaN layer 230, a pattern may be formed on the conductive layer 300 by photolithography such that the conductive layer includes at least one hole. An insulation layer 400 having at least one hole corresponding to the at least one hole of the conductive layer 300 may be formed on the conductive layer 300.

Figure 1C:
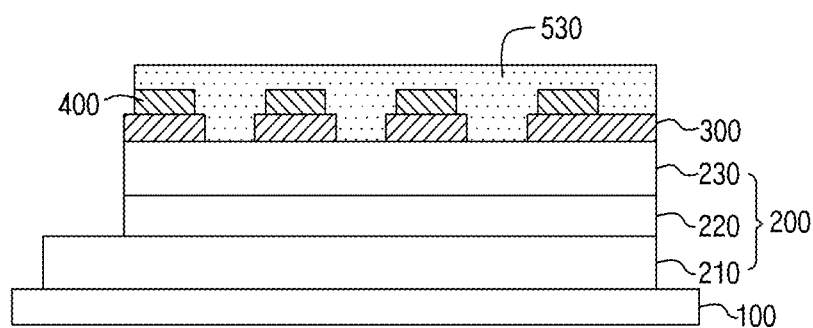

FIG. 1c shows a second p-GaN layer 530 formed by regrowing the first p-GaN layer 230 through a region where the at least one hole of the conductive layer 300 is disposed. Here, the second p-GaN layer 530 may be formed so as to contact a sidewall or upper surface of the conductive layer 300. Namely, the second p-GaN layer 530 may be formed on an upper surface of the insulation layer 400 formed on the conductive layer 300 while filling the hole of the conductive layer 300 and the hole of the insulation layer 400 on the conductive layer 300, as shown in FIG. 1c.

Figure 1D:
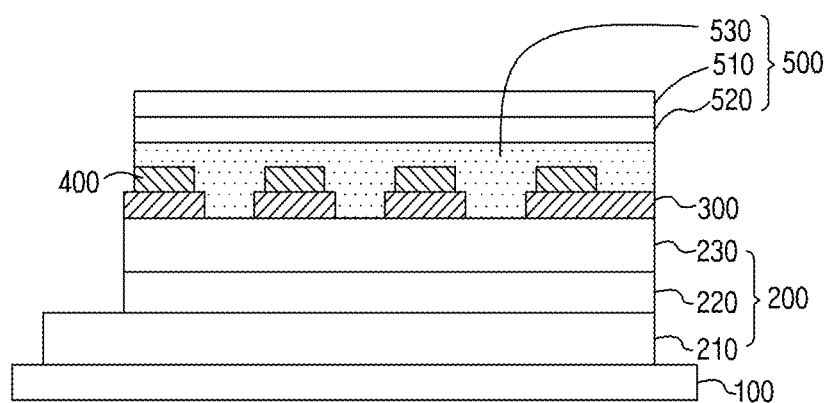

FIG. 1d shows a second light emitting structure 500 formed by sequentially stacking a second active layer 520 and a second n-GaN layer 510 on the second p-GaN layer 530. Here, the second active layer 520 and the second n-GaN layer 510 are formed on the second p-GaN layer 530 over a wide area not only above holes of the conductive layer 300 and the insulation layer 400 but also above the upper surface of the insulation layer, thereby forming the second light emitting structure 500 without being limited to a size thereof.

Figure 1E:
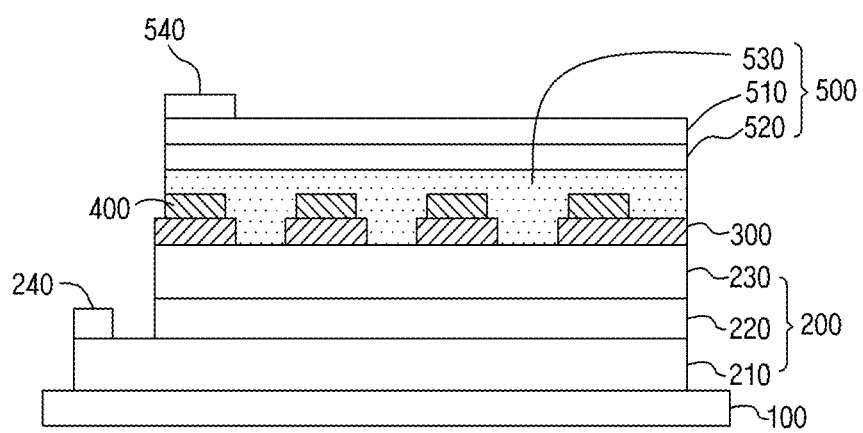

FIG. 1e shows a first n-type electrode 240, a second n-type electrode 540, and a p-type electrode 600, which are formed after forming the first light emitting structure 200 and the second light emitting structure 500, as shown in FIG. 1d. The first n-type electrode 240 may be formed at one side of the upper surface of the first n-GaN layer 210, which is exposed by partially removing the first light emitting structure 200 through mesa etching, as shown in FIG. 1a. The second n-type electrode 540 may be formed at one side of the upper surface of the second n-GaN layer 510 and the p-type electrode 600 may be formed at one side of the upper surface of the conductive layer 300. The first n-type electrode 240 may be electrically connected to the p-type electrode 600 to drive the first light emitting structure 200, and the second n-type electrode 540 may be electrically connected to the p-type electrode 600 to drive the second light emitting structure 500. With this structure, operation of the light emitting structure can be individually controlled through these three electrodes.

2. Method of Manufacturing Light Emitting Diode 2

Another aspect of the present invention provides a method of manufacturing a light emitting diode.

According to another aspect of the present invention, the method of manufacturing a light emitting diode includes: 1) forming a first light emitting structure on a substrate by sequentially stacking a first n-GaN layer, a first active layer, and a first p-GaN layer thereon; 2) forming a conductive layer having at least one hole on the first light emitting structure; 3) forming a second p-GaN layer group in a region in which the at least one hole of the conductive layer is disposed, by regrowing the first p-GaN layer through the at least one hole of the conductive layer; 4) forming a second light emitting structure group on the second p-GaN layer group by sequentially stacking a second active layer group and a second n-GaN layer group thereon.

Step 1), that is, the step of forming a first light emitting structure on a substrate by sequentially stacking a first n-GaN layer, a first active layer, and a first p-GaN layer thereon, and Step 2), that is, the step of forming a conductive layer having at least one hole on the first light emitting structure may be performed by the same processes as those of the method described in "1. Method of manufacturing light emitting diode 1" and thus detailed descriptions thereof will be omitted.

Step 3) is the step of forming a second p-GaN layer group in a region in which the at least one hole of the conductive layer is disposed, by regrowing the first p-GaN layer through the at least one hole of the conductive layer.

The second p-GaN layer group may include a plurality of second p-GaN layers respectively formed in holes of the conductive layer by regrowing the first p-GaN layer therethrough in regions in which holes of the conductive layer formed on the first light emitting structure are disposed. In the second p-GaN layer group, each of the second p-GaN layers may be formed to contact a sidewall or upper surface of the conductive layer. In some embodiments, each of the second p-GaN layers may be formed on a portion of the upper surface of the conductive layer instead of being formed on the overall upper surface of the conductive layer. In some embodiments, an insulation layer having at least one hole corresponding to the at least one hole of the conductive layer may be formed in a region of the conductive layer in which the at least one hole of the conductive layer is not disposed. In these embodiments, each of the second p-GaN layers may be formed to contact an inner surface of the hole of the insulation layer. Here, each of the second p-GaN layers may have a size restricted by the sidewall of the hole of the insulation layer.

Step 4) is the step of forming a second light emitting structure group on the second p-GaN layer group by sequentially stacking a second active layer group and a second n-GaN layer group thereon.

The second active layer group composed of second active layers may be formed by forming the second active layers on the second p-GaN layers, which constitute the second p-GaN layer group and are disposed in holes of the conductive layer. As described in "1. Method of manufacturing light emitting diode 1", each of the second active layers is a luminous area and may be composed of a nitride-based compound. The size of each of the second active layers may be restricted by the sidewall of the hole of the insulation layer.

The second n-GaN layer group composed of second n-GaN layers may be formed by forming the second n-GaN layers on the second active layers, which constitute the second active layer group and are disposed in holes of the conductive layer. Although some of the second n-GaN layers may have a size restricted by the sidewall of the hole of the insulation layer, the second n-GaN layers may have a higher height than the insulation layer. The second n-GaN layer group may also be formed by a deposition method known in the art.

The second p-GaN layer group, the second active layer group, and the second n-GaN layer group may be formed by selective area growth. As described above, selective area growth may generally refer to a technique in which a mask pattern is formed on the substrate such that a target material can be grown only on an exposed region corresponding to an open region in the mask pattern. In the present invention, the conductive layer formed on the first p-GaN layer and having at least one hole serves as the mask pattern, and the second p-GaN layer group may be formed by regrowing the first p-GaN layer in regions in which holes of the conductive layer are disposed to expose the first p-GaN layer. In this way, the light emitting structure may be formed by sequentially stacking the second active layer group and the second n-GaN layer group on the second p-GaN layer group through selective area growth. That is, the light emitting structure group may include a plurality of light emitting structures, each of which is formed by sequentially stacking the second p-GaN layer, the second active layer, and the second n-GaN layer. The size of the light emitting structure group can be restricted by the sidewall of the hole of the conductive layer and/or the sidewall of the hole of the insulation layer, whereby the light emitting structure group composed of the plurality of light emitting structures each having a micro-rod shape can be formed on the first light emitting structure.

As such, the second p-GaN layer group is formed to contact the sidewall or upper surface of the conductive layer, and, as described in "1. Method of manufacturing light emitting diode 1", the conductive layer can be used as a p-type contact layer of the light emitting structure group including the second p-GaN layer group.

FIG. 2a to FIG. 2e are sectional views illustrating a method of manufacturing a light emitting diode according to another embodiment of the present invention.

Referring to FIG. 2a to FIG. 2e, FIG. 2a shows a first light emitting structure 200 including a first n-GaN layer 210, a first active layer 220, and a first p-GaN layer 230 sequentially stacked on a substrate 100, in which the first light emitting structure 200 is partially removed by mesa etching in order to form a first n-type electrode 240 at one side of an upper surface of the first n-GaN layer 210.

Figure 2A:
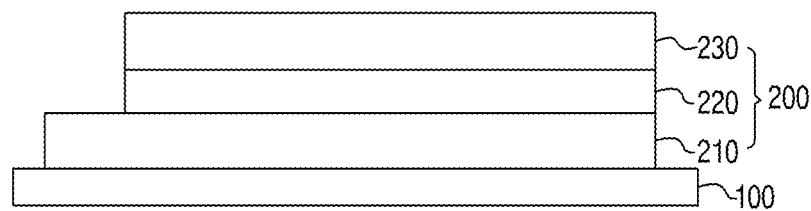
FIG. 2a to FIG. 2e are sectional views illustrating a method of manufacturing a light emitting diode according to one embodiment of the present invention.
Figure 2B:
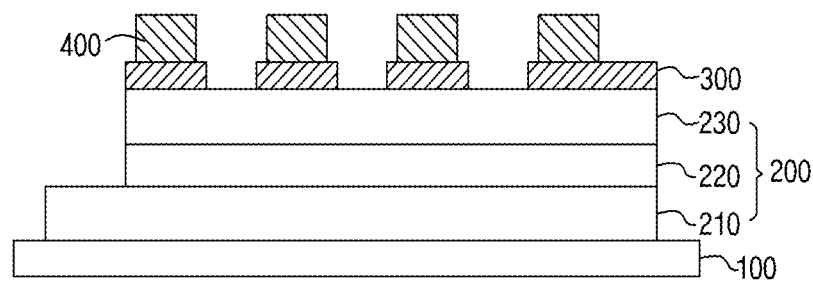

FIG. 2b shows a conductive layer 300 formed on the first p-GaN layer 230 of the first light emitting structure 200 on the substrate 100 and having at least one hole. The conductive layer 300 may be composed of at least one selected from among, for example, Co, Ni, Pt, Au, Se, Re, Ir, Pb, Ag, Cr, Zn, conducive metals having a work function of 4.4 eV or more, carbon nanotubes (CNT), graphene, indium tin oxide (ITO), ZnO, and IZO. After the conductive layer is deposited on an overall upper surface of the first p-GaN layer 230, a pattern may be formed on the conductive layer 300 by photolithography such that the conductive layer includes at least one hole. An insulation layer 400 having at least one hole corresponding to the at least one hole of the conductive layer 300 may be formed on the conductive layer 300.

Figure 2C:
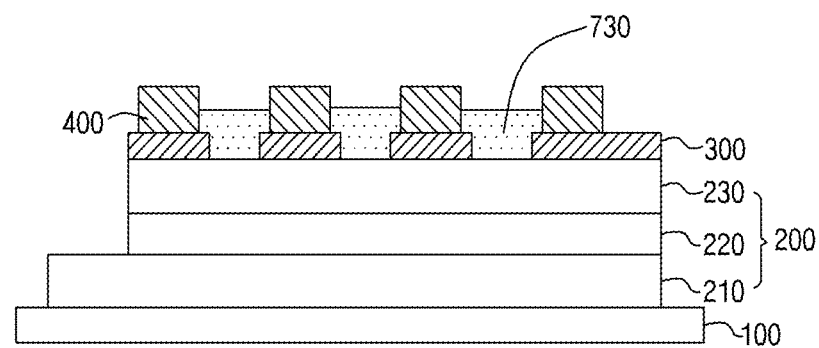

FIG. 2c shows a second p-GaN layer group 730 formed by regrowing the first p-GaN layer 230 through regions where holes of the conductive layer 300 are disposed. Here, the second p-GaN layer group 730 may be formed so as to contact a sidewall or upper surface of the conductive layer 300. The second p-GaN layer group 730 may be formed to fill holes of the conductive layer 300 and holes of the insulation layer 400 on the conductive layer 300, and the size of the second p-GaN layer group 730 can be restricted by the sidewall of the insulation layer 400.

Figure 2D:
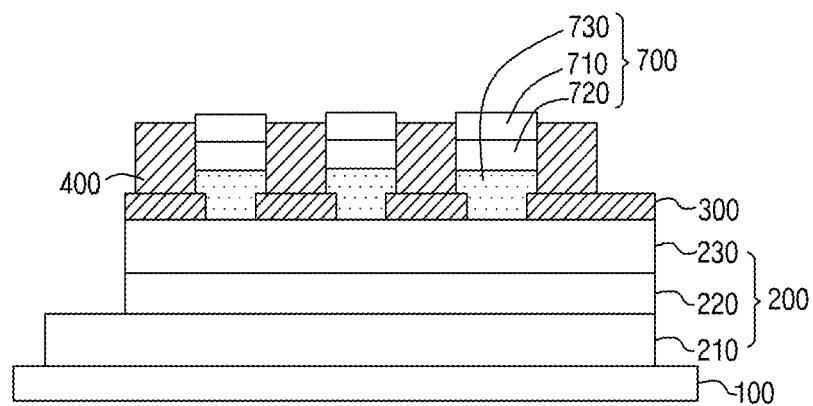

FIG. 2d shows a light emitting structure group 700 formed by sequentially stacking a second active layer group 720 and a second n-GaN layer group 710 on the second p-GaN layer group 730. The size of the second active layer group 720 can be restricted by the sidewall of the insulation layer 400. Although some of the second n-GaN layer group 710 may have a size restricted by the sidewall of the insulation layer, the second n-GaN layer group 710 may have a higher height than the insulation layer in some embodiments, as shown in FIG. 2d.

Figure 2E:
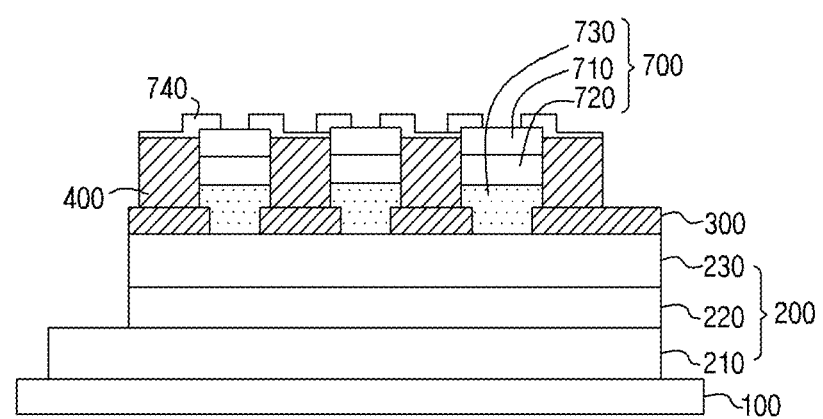
Figure 3A:
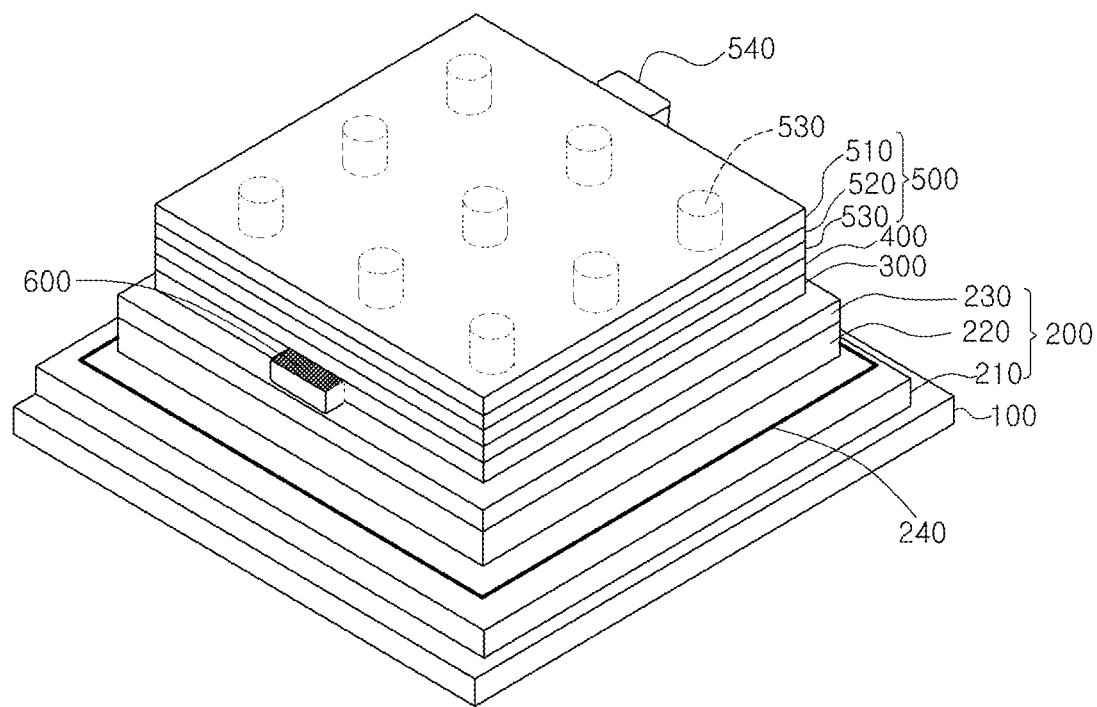
FIG. 3a is a perspective view of a light emitting diode according to one embodiment of the present invention and FIG. 3b is a sectional view of the light emitting diode according to the embodiment of the present invention.

FIG. 2e shows a first n-type electrode 240, a second n-type electrode 740, and a p-type electrode 600, which are formed after forming the first light emitting structure 200 and the light emitting structure group 700, as shown in FIG. 2d. The first n-type electrode 240 may be formed at one side of the upper surface of the first n-GaN layer 210, which is exposed by partially removing the first light emitting structure 200 through mesa etching, as shown in FIG. 3a. The second n-type electrode 740 may be formed at one side of the upper surface of the second n-GaN layer group 710 and the p-type electrode 600 may be formed at one side of the upper surface of the conductive layer 300. The first n-type electrode 240 may be electrically connected to the p-type electrode 600 to drive the first light emitting structure 200 and the second n-type electrode 740 may be electrically connected to the p-type electrode 600 to drive the light emitting structure group 700.

3. Light Emitting Diode 1

A further aspect of the present invention provides a light emitting diode.

The light emitting diode according to this aspect of the present invention may be manufactured by a manufacturing method described above in "1. Method of manufacturing light emitting diode 1". The light emitting diode includes: a first light emitting structure formed on a substrate and including a first n-GaN layer, a first active layer and a first p-GaN layer sequentially stacked thereon; a conductive layer formed on the first light emitting structure and having at least one hole; and a second light emitting structure including a second p-GaN layer formed in a region in which the at least one hole of the conductive layer is disposed, and a second active layer and a second n-GaN layer sequentially stacked on the second p-GaN layer, wherein the second p-GaN layer may be formed by regrowing the first p-GaN layer through the at least one hole of the conductive layer.

Since the light emitting diode is manufactured by a manufacturing method described above in "1. Method of manufacturing light emitting diode 1", details of the first light emitting structure formed on the substrate and including the first n-GaN layer, the first active layer and the first p-GaN layer sequentially stacked thereon, the conductive layer having at least one hole, the second p-GaN layer formed in the region in which the at least one hole of the conductive layer is disposed, and the second light emitting structure formed by sequentially stacking the second active layer and the second n-GaN layer on the second p-GaN layer may be the same as those of the light emitting diode described in "1. Method of manufacturing light emitting diode 1".

Thus, a detailed description of the light emitting diode according to this embodiment will be omitted, and the following description will focus on unique components of the light emitting diode.

Figure 3B:
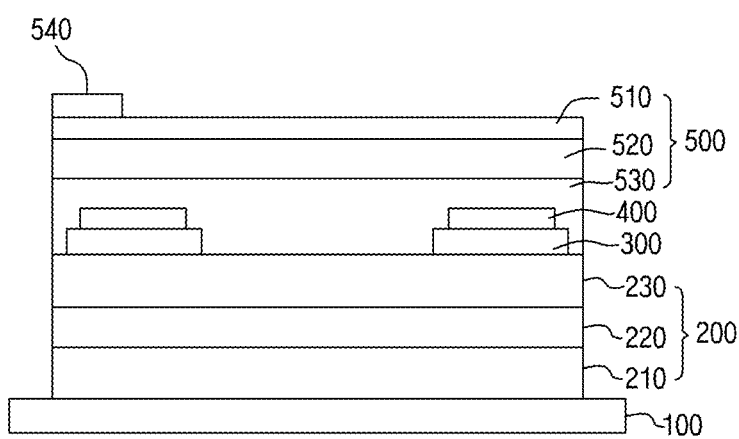

FIG. 3a is a perspective view of a light emitting diode according to one embodiment of the present invention and FIG. 3b is a sectional view of the light emitting diode according to the embodiment of the present invention.

Referring to FIG. 3a and FIG. 3b, a first light emitting structure 200 may be formed by sequentially stacking a first n-GaN layer 210, a first active layer 220, and a first p-GaN layer 230 on a substrate 100. A first n-type electrode 240 is disposed in an exposed region of the first n-GaN layer 210, which is exposed by partially removing the first light emitting structure 200 through mesa etching. A conductive layer 300 having at least one hole formed therein may be formed on the first light emitting structure 200. The at least one hole of the conductive layer 300 may have a circular shape. A second p-GaN layer 530 may be formed on the conductive layer 300 in a region in which the at least one hole of the conductive layer 300 is disposed. The second p-GaN layer 530 may be formed by regrowing the first p-GaN layer 230 through the at least one hole of the conductive layer 300. The second p-GaN layer 530 may be formed to contact a sidewall or upper surface of the conductive layer 300. A second active layer 520 and a second n-GaN layer 510 may be sequentially stacked on the second p-GaN layer 530. As a result, a second light emitting structure 500 composed of the second p-GaN layer 530, the second active layer 520, and the second n-GaN layer 510 can be formed. A second n-type electrode 540 may be formed at one side of an upper surface of the second n-GaN layer 510 and a p-type electrode 600 may be formed at one side of an upper surface of the conductive layer 300.

It can be seen that the second p-GaN layer 530 formed by regrowing the first p-GaN layer 230 through the hole of the conductive layer 300 is formed not only inside the conductive layer 300 but also on the insulation layer 400, which is formed on the conductive layer 300. Thus, the second p-GaN layer 530 may be formed in a wide area without being affected by the size of the hole of the conductive layer 300 or the sizes of the conductive layer 300 and the insulation layer 400. Accordingly, the second active layer 520 and the second n-GaN layer 510 formed on the second p-GaN layer 530 may be formed in a large area without being restricted by size. As a result, in the light emitting diode, a lower portion of the second p-GaN layer 530 is composed of a plurality of rod shapes and an upper portion of the second p-GaN layer 530 has a flat and wide structure, thereby providing the second light emitting structure 500 that includes the second active layer 520 formed on the second p-GaN layer 530 and having a large luminous area.

The second p-GaN layer is formed to contact the sidewall or upper surface of the at least one hole of the conductive layer, and the conductive layer can be used as a p-type contact layer of the second light emitting structure. Thus, the p-type electrode formed at one side of the upper surface of the conductive layer 300 may be electrically connected to the second n-type electrode formed on the second n-GaN layer to drive the second light emitting structure. As described above, the p-type electrode may be electrically connected to the first n-type electrode to drive the first light emitting structure. As such, the light emitting diode according to the present invention has the structure in which the second p-GaN layer is formed to contact the sidewall or upper surface of the at least one hole of the conductive layer such that the conductive layer can be used as the p-type contact layer of the second light emitting structure, thereby enabling individual operational control of the first light emitting structure and the second light emitting structure through the p-type electrode as a common electrode.

That is, in the light emitting diode according to the present invention, the first light emitting structure is driven through connection between the first n-type electrode and the p-type electrode and the second light emitting structure is driven through connection between the second n-type electrode and the p-type electrode, thereby allowing independent or interrelated operational control of the first light emitting structure and the second light emitting structure.

Since such structural characteristics of the light emitting diode allow independent operational control of the light emitting structures in a single light emitting diode so as to realize light having a specific wavelength, the light emitting structures may have different compound compositions in order to emit light having the same or different wavelengths. With the structure of emitting light of different wavelengths, a single light emitting diode can have an effect of emitting various colors. With the structure of emitting light having the same wavelength, a single light emitting diode can realize light having the same wavelength through two light emitting structures thereof, thereby providing high brightness and high efficiency.

Further, the light emitting diode allows interrelated operational control of the light emitting structures so as to emit mixed light obtained by mixing light emitted from the light emitting structures, whereby a single light emitting diode can emit a desired color.

Figure 4A:
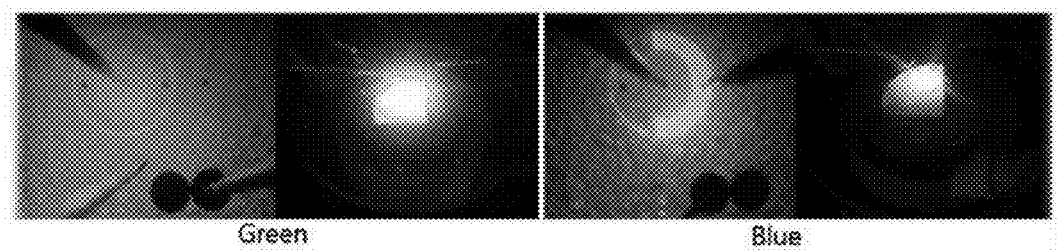
FIG. 4a to FIG. 4c show luminous images of the light emitting diode according to the embodiment of the present invention and a graph depicting spectra of light emitted from the light emitting diode according to the embodiment of the present invention.
Figure 4B:
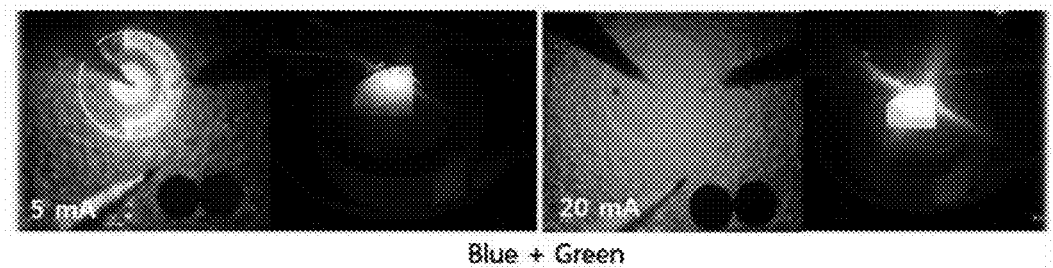
Figure 4C:
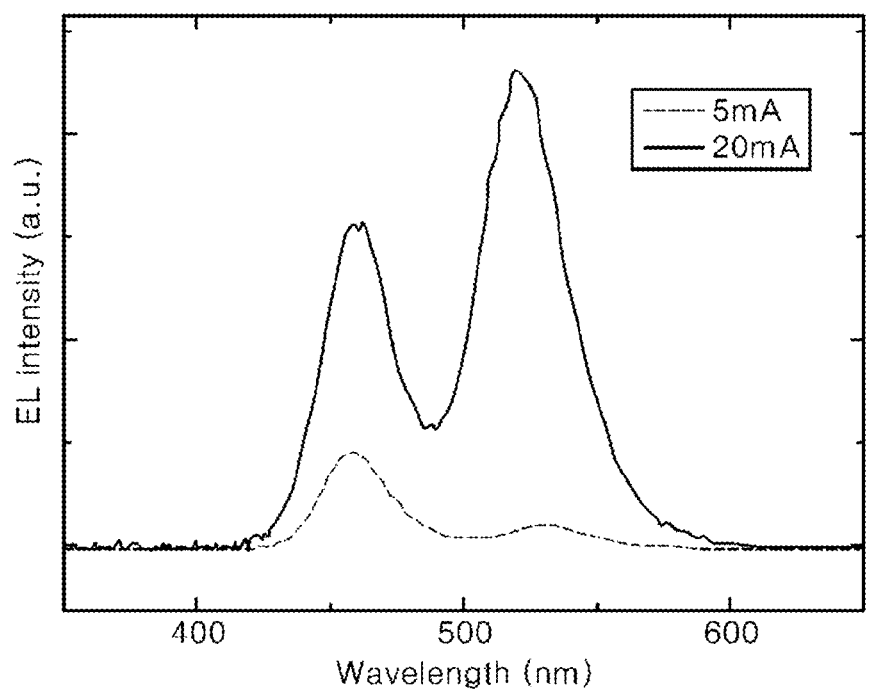

FIG. 4a to FIG. 4c show luminous images of the light emitting diode according to the embodiment of the present invention and a graph depicting spectra of light emitted from the light emitting diode according to the embodiment of the present invention.

Referring to FIG. 4a, it can be seen that the light emitting diode emits green light and blue light through the first light emitting structure and the second light emitting structure having different compositional ratios of nitride-based compounds.

Referring to FIG. 4b, it can be seen that the light emitting diode emits mixed light of green light and blue light through the first light emitting structure and the second light emitting structure having different structural characteristics. This result means that a specific color can be realized by the light emitting diode according to the present invention, in which the first light emitting structure and the second light emitting structure are joined to each other.

Referring to FIG. 4c, it can be seen that luminous efficacy of the light emitting diode is better in a specific wavelength range (green light and blue light) at an electric current of 20 mA than at an electric current of 5 mA.

In this way, unlike a typical light emitting diode configured to emit light of a specific wavelength using phosphors causing deterioration in color rendering index, the light emitting diode according to the present invention can emit light of two or more specific wavelengths using the structural characteristics that two light emitting structure are joined to each other in one light emitting diode without mixing specific materials. Further, since the light emitting diode according to the present invention can emit light of various colors through adjustment of the compositional ratios of the first light emitting structure and the second light emitting structure, the light emitting diode can realize a high pixel density. Here, each of the light emitting structures can be individually controlled to maintain luminous intensity, whereby the light emitting diode can be very usefully applied to related industries.

The conductive layer may be used as a current spreading layer that spreads electric current supplied through the p-type electrode to the first light emitting structure and the second light emitting structure. The conductive layer may be composed of at least one selected from among, for example, Co, Ni, Pt, Au, Se, Re, Ir, Pb, Ag, Cr, Zn, conducive metals having a work function of 4.4 eV or more, carbon nanotubes (CNT), graphene, indium tin oxide (ITO), ZnO, and IZO. As described above, with the structural characteristics of the conductive layer, the sidewall or upper surface of which contacts the second p-GaN layer, and with the characteristics of the conductive material thereof, the conductive layer can serve as a p-type contact layer of the second light emitting structure and as a current spreading layer that spreads electric current, which flows through the p-type electrode formed at one side of the upper surface of the conductive layer, to the first light emitting structure and the second light emitting structure. With this structure, the light emitting diode can exhibit high luminous efficacy.

The conductive layer can be used as a mask pattern for growth of the second p-GaN layer. Since the second p-GaN layer is formed by regrowing the first p-GaN layer through the at least one hole of the conductive layer, the conductive layer can serve as the mask pattern for growth of the second p-GaN layer. In this way, the conductive layer is used as the mask pattern, whereby the second p-GaN layer can be formed to have a desired size in a desired region through selective area growth.

The second p-GaN layer is also disposed on the upper surface of the conductive layer, whereby a luminous area of the second active layer formed on the second p-GaN layer can be enlarged. That is, the second p-GaN layer is formed not only in the region in which the at least one hole of the conductive layer is disposed, but also on the upper surface of the conductive layer, whereby the second p-GaN layer can be formed in a large area without being restricted by the size of the hole of the conductive layer. With this structure, the second active layer formed on the second p-GaN layer can have a large area, thereby increasing the luminous area of the second active layer. As such, luminous efficacy of the second light emitting structure can also be improved due to increase in luminous area of the second active layer.

The light emitting diode further includes the insulation layer formed in the region in which the at least one hole of the conductive layer is not disposed, and the insulation layer may include at least one hole corresponding to the at least one hole of the conductive layer. In this structure, the second p-GaN layer formed to contact the sidewall or upper surface of the conductive layer may be formed not only inside the at least one hole of the insulation layer but also on the upper surface of the insulation layer.

4. Light Emitting Diode 2

Yet another aspect of the present invention provides a light emitting diode.

The light emitting diode according to this aspect of the present invention may be manufactured by a manufacturing method described above in "2. Method of manufacturing light emitting diode 2". The light emitting diode includes: a first light emitting structure formed on a substrate and including a first n-GaN layer, a first active layer and a first p-GaN layer sequentially stacked thereon; a conductive layer formed on the first light emitting structure and having at least one hole; a second light emitting structure including a second p-GaN layer group formed in regions in which holes of the conductive layer are disposed, and a second active layer group and a second n-GaN layer group sequentially stacked on the second p-GaN layer, wherein the second p-GaN layer group may be formed by regrowing the first p-GaN layer through holes of the conductive layer.

Figure 5A:
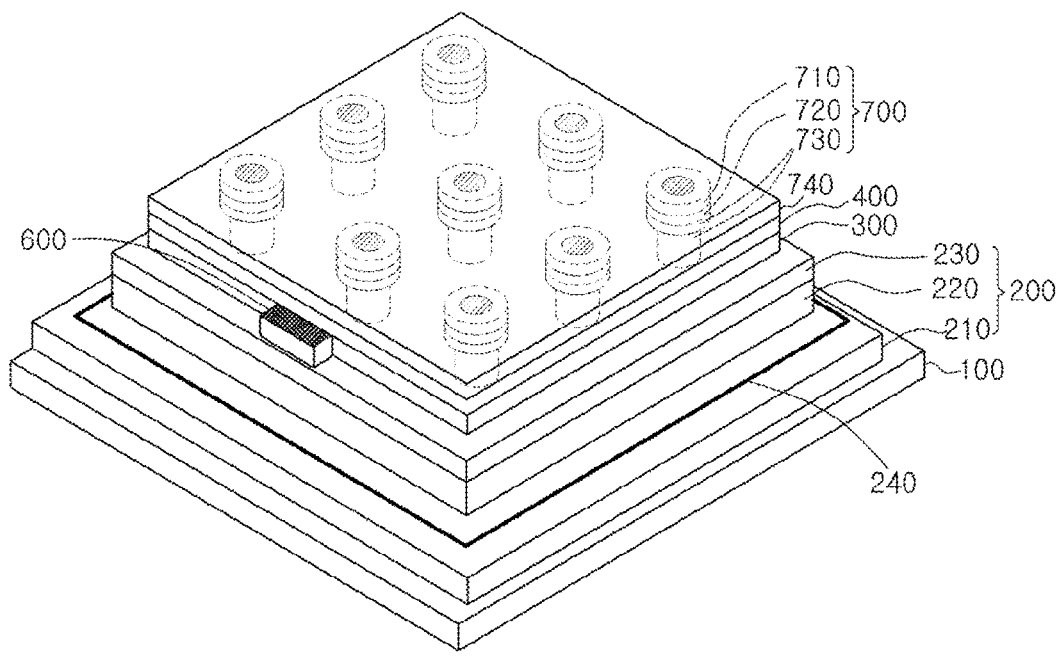
FIG. 5a is a perspective view of a light emitting diode according to another embodiment of the present invention and FIG. 5b is a sectional view of the light emitting diode according to the embodiment of the present invention.
Figure 5B:
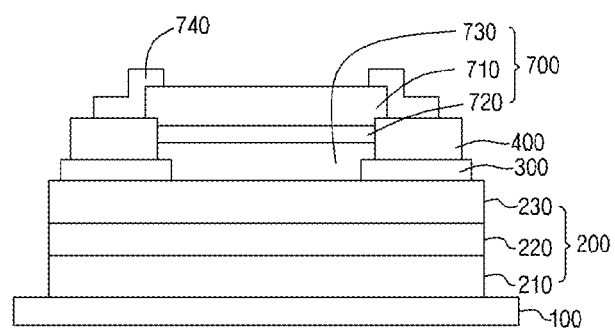

FIG. 5a is a perspective view of a light emitting diode according to another embodiment of the present invention and FIG. 5b is a sectional view of the light emitting diode according to the embodiment of the present invention.

Referring to FIG. 5a and FIG. 5b, a first light emitting structure 200 is formed by sequentially stacking a first n-GaN layer 210, a first active layer 220, and a first p-GaN layer 230 on a substrate 100, and a conductive layer 300 having holes is formed on the first light emitting structure 200. A second p-GaN layer group 730, formed by regrowing the first p-GaN layer 230 through holes of the conductive layer 300, fills holes of the conductive layer 300. The second p-GaN layer group 730 contacts a sidewall or upper surface of the conductive layer.

An insulation layer 400 having holes corresponding to holes of the conductive layer 300 is formed on the conductive layer 300, and the second p-GaN layer group 730 is formed to fill part of holes of the insulation layer 400. To this end, holes of the insulation layer 400 may have a larger diameter than holes of the conductive layer 300. A light emitting structure group 700 may be formed on the second p-GaN layer group 530 by stacking a second active layer group 520 and a second n-GaN layer group 510 thereon, and a second n-type electrode 740 may be formed on the light emitting structure group 700.

The second p-GaN layer group 730 is formed to contact sidewalls of holes of the conductive layer 300 or the upper surface of the conductive layer 300, and the conductive layer 300 may be used as a p-type contact layer of the light emitting structure group 700 including the second p-GaN layer group 730. Thus, a p-type electrode 600 formed at one side of the upper surface of the conductive layer 300 is connected to a second n-type electrode 740 formed on the second n-GaN layer group to drive the light emitting structure group 700. The p-type electrode 600 may be connected to a first n-type electrode 240 to drive the first light emitting structure 200. With this structure, the light emitting diode according to the present invention has the structure wherein the second p-GaN layer group 730 is formed to contact the sidewalls of holes of the conductive layer 300 or the upper surface of the conductive layer 300, the conductive layer 300 can be used as the p-type contact layer of the light emitting structure group 700, thereby enabling individual operational control of the first light emitting structure 200 and the light emitting structure group 700 through the p-type electrode 600 as a common electrode.

In addition, the second active layer group 720 and a second n-GaN layer group 710 contact a sidewall of the insulation layer 400. The size of the light emitting structure group 700 is restricted by the size of holes of the conductive layer 300 or by the sizes of the conductive layer 300 and the insulation layer 400. Accordingly, the light emitting diode may include a plurality of light emitting structures 700 each having a micro-rod shape and formed on the first light emitting structure 200 corresponding to the number of holes formed in the conductive layer 300, and all of these light emitting structures may be electrically connected to each other. The number of holes in the conductive layer 300 is not particularly limited.

The light emitting structure group includes a plurality of light emitting structures, each of which includes a second p-GaN layer, a second active layer, and a second n-GaN layer sequentially stacked in the stated order and may be independently formed in a region in which at least one hole of the conductive layer is disposed. By the second p-GaN layer group formed through holes of the conductive layer, the light emitting structure group may include the plurality of light emitting structures, each of which includes the second p-GaN layer, the second active layer, and the second n-GaN layer sequentially stacked in the stated order. These light emitting structures may be formed through simultaneous growth or may be independently formed in the regions in which holes of the conductive layer are disposed. The light emitting structures may be connected to each other so as to constitute one light emitting structure group, and electrical connection between the light emitting structures may be realized in various ways as needed, without being limited to a particular one.

Figure 6A:
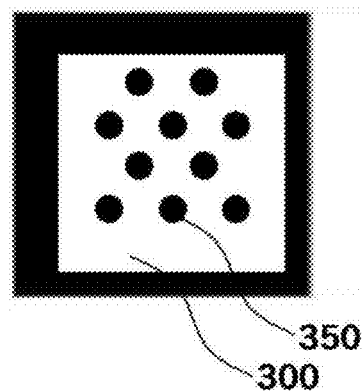
FIG. 6a is a sectional view of a conductive layer according to one embodiment of the present invention and FIG. 6b is a schematic sectional view of an insulation layer according to one embodiment of the present invention.
Figure 6B:
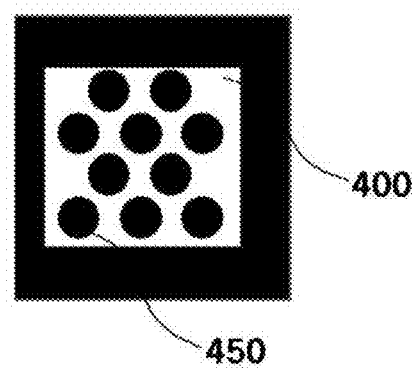

FIG. 6a is a sectional view of a conductive layer according to one embodiment of the present invention and FIG. 6b is a schematic sectional view of an insulation layer according to one embodiment of the present invention.

Referring to FIG. 6a, a conductive layer 300 includes one or more holes 350 arranged at regular intervals. The second p-GaN layer or the second p-GaN layer group may be formed by regrowing the first p-GaN layer formed under the conductive layer 300 in regions where one or more holes 350 of the conductive layer 300 are disposed. The conductive layer 300 including one or more holes 350 formed therein can serve as a mask pattern for growing the second p-GaN layer or the second p-GaN layer group.

Referring to FIG. 6b, an insulation layer 400 includes one or more holes 450 arranged at regular intervals. Holes 450 may have a larger size than holes 350 of the conductive layer shown in FIG. 6a. Due to the insulation layer 400 including one or more holes 450 corresponding to holes 350 of the conductive layer 300 and arranged at regular intervals, the second light emitting structure or the light emitting structure group may have various structures according to embodiments.

Although some embodiments have been described herein, these embodiments are given by way of illustration only and should not be construed as limiting the scope of the present invention. It should be understood by those skilled in the art that various modifications, variations and alterations can be made without departing from the spirit and scope of the invention.

LIST OF REFERENCE NUMERALS

100: substrate 200: first light emitting structure
210: first n-GaN layer 220: first active layer
230: first p-GaN layer 240: first n-type electrode
300: conductive layer 350: hole of conductive layer
400: insulation layer 450: hole of insulation layer
500: second light emitting structure 510: second n-GaN layer
520: second active layer 530: second p-GaN layer
540, 740: second n-type electrode 600: p-type electrode
700: light emitting structure group 710: second n-GaN layer group
720: second active layer group 730: second p-GaN layer group

The invention claimed is:

1. A light emitting diode comprising:
a first light emitting structure formed on a substrate and comprising a first n-GaN layer, a first active layer and a first p-GaN layer sequentially stacked thereon;

a conductive layer formed on the first light emitting structure and having at least one hole; and a second light emitting structure comprising a second p-GaN layer formed in a region in which the at least one hole of the conductive layer is disposed, and a second active layer and a second n-GaN layer sequentially stacked on the second p-GaN layer, wherein the second p-GaN layer is formed by regrowing the first p-GaN layer through the at least one hole of the conductive layer and is formed to contact an upper surface of the conductive layer.

2. The light emitting diode according to claim 1, further comprising:

a first n-type electrode formed at one side of an upper surface of the first n-GaN layer;

a second n-type electrode formed at one side of an upper surface of the second n-GaN layer; and a p-type electrode formed at one side of the upper surface of the conductive layer.

3. The light emitting diode according to claim 2, wherein the conductive layer is used as a current spreading layer for spreading electric current supplied through the p-type electrode to the first light emitting structure and the second light emitting structure.

4. The light emitting diode according to claim 2, wherein the first light emitting structure is configured to be driven through connection between the first n-type electrode and the p-type electrode, and the second light emitting structure is configured to be driven through connection between the second n-type electrode and the p-type electrode such that operational control of the first light emitting structure and the second light emitting structure is performed independently or in an interrelated way.

5. The light emitting diode according to claim 1, wherein the conductive layer is used as a mask pattern for growth of the second p-GaN layer.

6. The light emitting diode according to claim 1, wherein the conductive layer comprises at least one selected from among Co, Ni, Pt, Au, Se, Re, Ir, Pb, Ag, Cr, Zn, conductive metals having a work function of 4.4 eV or more, carbon nanotubes (CNT), graphene, indium tin oxide (ITO), ZnO, and IZO.

7. The light emitting diode according to claim 1, further comprising:

an insulation layer formed in a region in which the at least one hole of the conductive layer is not disposed, the insulation layer having at least one hole located corresponding to the at least one hole of the conductive layer.

8. The light emitting diode according to claim 7, wherein the second p-GaN layer extending through the conductive layer and terminating over the insulating layer so as to extend to the upper surface of the insulating layer.

9. The light emitting diode according to claim 7, wherein the second n-GaN layer is formed to extend to the upper surface of the insulating layer.

10. A light emitting diode comprising:

a first light emitting structure formed on a substrate and comprising a first n-GaN layer, a first active layer and a first p-GaN layer sequentially stacked thereon;

a conductive layer formed on the first light emitting structure and having at least one hole; and a second light emitting structure including a second p-GaN layer group formed in a region in which the at least one hole of the conductive layer is disposed, and a second active layer group and a second n-GaN layer group sequentially stacked on the second p-GaN layer, wherein the second p-GaN layer group is formed by regrowing the first p-GaN layer through the at least one hole of the conductive layer and is formed to contact an upper surface of the conductive layer.

11. The light emitting diode according to claim 10, wherein the second light emitting structure comprises one or more light emitting structures each comprising a second p-GaN layer, a second active layer, and a second n-GaN layer sequentially stacked in the stated order, each of the light emitting structures being independently formed in the region in which the at least one hole of the conductive layer is disposed.

12. A method of manufacturing a light emitting diode, comprising:

forming a first light emitting structure on a substrate by sequentially stacking a first n-GaN layer, a first active layer, and a first p-GaN layer thereon;

forming a conductive layer having at least one hole on the first light emitting structure;

forming a second p-GaN layer in a region in which the at least one hole of the conductive layer is disposed, by regrowing the first p-GaN layer through the at least one hole of the conductive layer, wherein the second p-GaN layer is formed to contact an upper surface of the conductive layer; and forming a second light emitting structure on the second p-GaN layer by sequentially stacking a second active layer and a second n-GaN layer thereon.

13. The method of manufacturing a light emitting diode according to claim 12, further comprising: after forming the second light emitting structure, forming a second n-type electrode at one side of an upper surface of the second n-GaN layer; and forming a p-type electrode at one side of an upper surface of the conductive layer.

14. The method of manufacturing a light emitting diode according to claim 12, wherein forming the conductive layer having at least one hole on the first light emitting structure comprises:

depositing the conductive layer on the first light emitting structure; and forming a pattern having at least one hole on the conductive layer through lithography.

15. The method of manufacturing a light emitting diode according to claim 12, wherein the conductive layer has a thickness of 10 nm to 1 μm.

16. The method of manufacturing a light emitting diode according to claim 12, wherein forming the second p-GaN layer is performed through selective area growth (SAG).

17. The method of manufacturing a light emitting diode according to claim 12, further comprising:

forming an insulation layer formed in a region in which the at least one hole of the conductive layer is not disposed, the insulation layer having at least one hole located corresponding to the at least one hole of the conductive layer.

18. The method of manufacturing a light emitting diode according to claim 17, wherein the insulation layer is formed of at least one selected from among $SiO_2$, SOG (spin-on-glass), or a material having thermal resistance at a temperature of 900° C. or less.

19. The method of manufacturing a light emitting diode according to claim 12, wherein the second p-GaN layer extending through the conductive layer and terminating over the insulating layer so as to extend to the upper surface of the insulating layer.

* * * * *